United States Patent [19]

Frye

[11] 4,069,447
[45] Jan. 17, 1978

[54] STABILIZED HIGH-EFFICIENCY SAMPLING SYSTEM

[75] Inventor: George Joseph Frye, Beaverton, Oreg.

[73] Assignee: Tektronix, Inc., Beaverton, Oreg.

[21] Appl. No.: 498,797

[22] Filed: Aug. 19, 1974

Related U.S. Application Data

[63] Continuation of Ser. No. 321,877, Jan. 8, 1973, abandoned.

[51] Int. Cl.² .................... H02J 15/00; G11C 11/24
[52] U.S. Cl. .................................... 320/1; 328/151; 365/149
[58] Field of Search .................... 307/109, 238; 320/1; 328/127, 151; 235/183; 340/173 CA, 347 SH

[56] References Cited

U.S. PATENT DOCUMENTS

| | | | |
|---|---|---|---|
| 3,059,228 | 10/1962 | Beck et al. | 340/347 SH |
| 3,157,859 | 11/1964 | Moore et al. | 340/173 CA |
| 3,380,035 | 4/1968 | Hecker | 340/173 CA |
| 3,474,259 | 10/1969 | Rodgers | 340/173 CA |
| 3,701,909 | 10/1972 | Holmes et al. | 328/151 |
| 3,753,132 | 8/1973 | Hill | 328/151 |

OTHER PUBLICATIONS

Hansen, Burst Mode Sampling Amplifier, IBM Technical Disclosure Bulletin, vol. 14, No. 7, 12/71, pp. 2196–2197.
Mulvey, Sampling Oscilloscope Circuits, Tektronix, Inc., 3/70.
Gambrel, Sample and Hold Circuit, IBM Technical Disclosure Bulletin, vol. 11, No. 8, 1/69, pp. 908–909.

*Primary Examiner*—Stuart N. Hecker
*Attorney, Agent, or Firm*—George T. Noe; Adrian J. LaRue

[57] ABSTRACT

An improved electronic sampling circuit combines the merits of a high-efficiency sampling system with the DC stability of the more standard feedback sampling system. The stabilized high-efficiency sampling system is very useful for sampling high-speed events at a fixed repetition rate, such as occurs in time-domain reflectometry applications, as well as for sampling at very low trigger rates or at varying trigger rates such as are found in general-purpose sampling equipment. The high-efficiency characteristic of this sampling system is obtained by adjusting the effective memory capacitance of a sampling gate to provide unity dot response. The DC stability characteristic is maintained by a resistive feedback loop from the system output to input.

9 Claims, 2 Drawing Figures

STABILIZED HIGH-EFFICIENCY SAMPLING SYSTEM

This is a continuation of application Ser. No. 321,877 filed Jan. 8, 1973, now abandoned.

BACKGROUND OF THE INVENTION

One form of a sampling system consists of a sampling gate followed by a memory storage capacitor and a non-loading voltage follower. This system is very simple, causing the gate to repetitively take samples at one point on an input waveform which will charge the memory capacitor to a voltage equal to that of the input waveform at that point in time. When the sampling point is shifted to a new point on the waveform, the memory capacitor charges to a new voltage. An important characteristic of efficient sampling systems is a quick dot-transient response, which is defined as the ability of a sampling oscilloscope to display correctly any voltage change between any two successive samples. Therefore, the number of samples needed to fully charge the memory capacitor should be as small as possible. To provide the quick response required by this form of sampling system, it is necessary to reduce the size of the memory capacitor. However, for pulse-design circuit reasons, it is very difficult to design sampling gates with a memory capacitor having less than 6 to 20 picofarads of capacitance.

The effective memory capacitance of the sampling gate can be reduced by paralleling the actual positive capacitance with a negative capacitance from the feedback element of a non-loading positive-gain amplifier having a gain greater than unity. Thus the response of the sampling system is made to require a much smaller number of samples than would otherwise be found with that form of gate and is easily controlled by adjustment of the feedback current to the memory capacitor.

It is also difficult to maintain DC stability at low sampling rates in the high-efficiency system just described because of the magnitude of the leakage currents found in high-speed sampling diodes, coupled with the low effective memory capacitance created by the positive feedback in the preamplifier. Such low capacitance with leakage causes vertical movement, known as "slashing," of the dot between samples.

SUMMARY OF THE INVENTION

According to the present invention, a high efficiency in sampling high-speed events at a fixed high-repetition rate is combined with the DC stability required for sampling at very low or varying trigger rates. The DC stability characteristic is maintained by a resistive feedback path from system output to input, allowing a great simplification in circuitry while maintaining excellent low-trigger-rate operation. Noise is also reduced by a factor of 5 or better because of the 100X reduced bandwidth requirement of the amplifier system. It is also possible to operate the associated strobe generator up to above one megahertz because the resistive feedback loop does not need to recover between samples as in a standard sampling system. Additionally, it is much easier to trouble shoot this system because of its quick response at high strobe repetition rates, removing the requirement that the resistive feedback loop be connected for stable operation. Memory gate conduction time is also non-critical.

It is therefore one object of the present invention to provide an improved sampling system combining the merits of a high-efficiency sampling system with the DC stability of the more standard feedback system.

It is another object of the present invention to combine AC feedback and DC feedback in a sampling system thereby combining high-efficiency with DC stability.

It is a further object of the present invention to substantially reduce noise in the system by reducing the amplifier bandwidth requirement.

It is still another object of the present invention to maintain the charge on the sampling-gate storage capacitor against the leakage of the high-speed sampling-gate diodes by providing such leakage current through a resistive feedback loop.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings.

DETAILED DESCRIPTION

Figure 1:
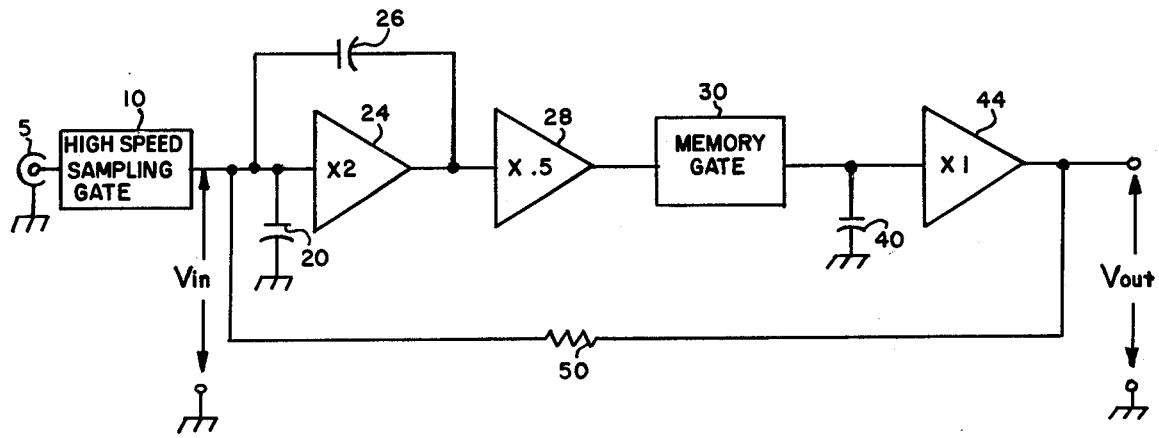
FIG. 1 is a block diagram of the present invention.
Figure 2:
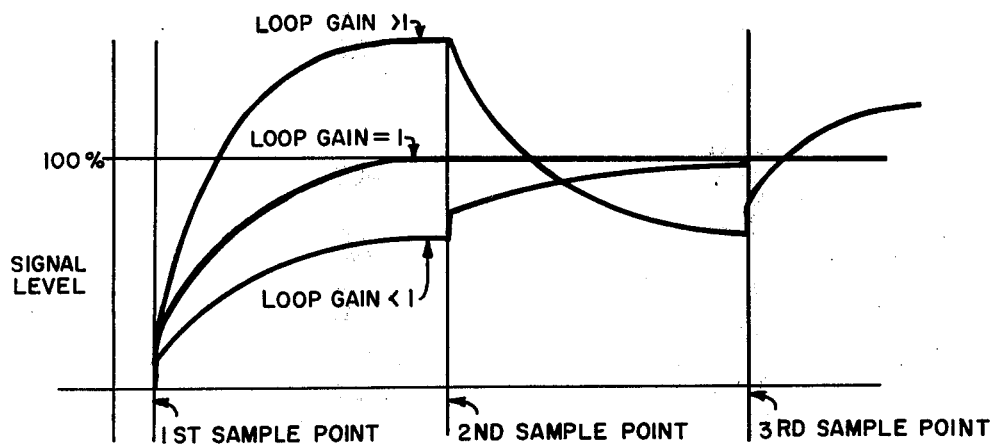
FIG. 2 is an idealized waveform showing the charge rate of the effective capacitance of the sampling storage capacitor for loop gains of 1, less than 1, and more than 1.

Referring to FIG. 1, a sampling system according to the present invention is provided with a repetitive input signal waveform at input connector five. The high-speed sampling gate 10 is opened for several picoseconds upon command from a strobe signal in the conventional sampling-system manner. During this brief period of time, the instantaneous voltage level of the input signal, hereinafter referred to as the voltage sample or $V_{in}$, is passed to storage capacitor 20 and the input of amplifier 24. Storage capacitor 20 begins to charge toward $V_{in}$, however, it cannot respond instantaneously. Amplifier 24 provides a gain of twice $V_{in}$ at its output terminal, and hence, to feedback capacitor 26. Due to the positive feedback via capacitor 26 to the input of amplifier 24, sufficient current can be injected into or ejected from capacitor 20 to respectively charge or discharge it to $V_{in}$. As seen from a basic equation of physics, $i = C(de/dt)$, precise response of capacitor 20 can be attained by making capacitor 26 a variable component and adjusting its capacitance value. This effect is shown in FIG. 2, where the loop gain is ideally equal to one.

Amplifier 28 is inserted in the system to provide isolation between preamplifier 24 and memory gate 30, and also divides the voltage sample back down to $V_{in}$ at its output.

Shortly after a voltage sample has been taken, memory gate 30 is made to conduct, and memory capacitor 40 charges toward $V_{in}$. When the voltage at the output of amplifier 44 approaches its final value for that sample, the memory gate is then made to stop conducting. At this point, $V_{out}$ is close to $V_{in}$, and the feedback current to amplifier 24 via resistor 50 holds the charge on capacitor 20. Thus DC stability is achieved for very low or varying input-signal trigger rates. After several samples, as in conventional sampling systems, $V_{out}$ is equal to the level of the signal at the sampling instant.

The value of memory capacitor 40 is chosen to be large enough to make leakage effects in memory gate 30 and amplifier 44 negligible. The value of resistor 50 is chosen to be small compared to the shunt resistance of the high-speed sampling-gate diodes.

Additionally, from equation $i = C(de/dt)$ it can be seen that the current response required by capacitor 20 can also be achieved by fixing the value of capacitor 26 and varying the gain of amplifier 24 without deviating from the scope of the present invention. However, this would necessitate also changing the gain of amplifier 28 to correct the overall system gain to unity.

While I have shown and described a block diagram of my invention, it will be apparent to those skilled in the art that many changes and modifications may be made without departing from my invention in its broader aspects.

We claim:

1. A sampling system comprising:
   sampling gate means for collecting instantaneous voltage values of an input signal,
   first storage means for first storing said instantaneous voltage values,
   first feedback means connected to said first storage means for enabling said first storage means to respond precisely to said instantaneous voltage values,
   second storage means for second memory storage of said instantaneous voltage values,
   memory gate means for transferring said instantaneous voltage value from said first storage means to said second storage means,
   an output terminal connected to said second storage means, and
   second feedback means connected between said output terminal and said first storage means for maintaining said first storage means at said instantaneous voltage values.

2. The system according to claim 1 wherein said first storage means comprises a capacitive element, and said first feedback means comprises a capacitive feedback loop from the output terminal of a positive-gain amplifier to the input terminal thereof, said input terminal also being connected to said first storage means.

3. The system according to claim 2 including adjustable means for varying the effective capacitance of said first storage means without affecting the actual capacitance thereof.

4. The system according to claim 1 wherein said second feedback means comprises a resistive feedback loop from the output terminal of said sampling system to said first storage means.

5. A stabilized high-efficiency sampling system comprising:
   sampling gate means for sampling voltage of a high-speed or a low-speed input signal,
   first memory storage means connected to said sampling gate means for storing said voltage sample,
   feedback amplifier means connected to said first memory storage means for providing sufficient current to said first memory storage means to enable said first memory storage means to respond precisely to said voltage sample taken,
   memory gate means connected to said feedback amplifier means for transferring said voltage sample value to a second memory storage means,
   second memory storage means connected to said memory gate means for storing a voltage equal in value to said voltage sample taken, and
   DC stabilization means including resistive means connected from the output of said stabilized high-efficiency sampling system to said first memory storage means for maintaining the stored value of said voltage sample.

6. The system according to claim 5 wherein said first memory storage means comprises a capacitive element, and said feedback amplifier means comprises a positive-gain amplifier with a capacitive feedback element to effectively parallel said capacitive element of said first memory storage means and thereby reduce the effective memory storage capacitance thereof without reducing the actual capacitance thereof, said feedback amplifier means also including means for adjusting said effective capacitance of said first memory storage means.

7. A sampling system comprising:
   sampling gate means for collecting instantaneous voltage values of an input signal;
   first storage means connected to said sampling gate means for first storage of said instantaneous voltage values;
   first amplifier means having an input connected to said first storage means for providing unity-gain in-phase amplification of said instantaneous voltage values, said first amplifier means including AC feedback means for enabling said first storage means to respond precisely to said instantaneous voltage values;
   memory gate means connected to an output of said first amplifier means for passage therethrough of said instantaneous voltage values;
   second amplifier means having an input connected to said memory gate means for providing unity-gain in-phase amplification of said instantaneous voltage values, said second amplifier means including second storage means for second storage of said instantaneous voltage values; and
   DC feedback means connected between an output of said second amplifier means and said first storage means for maintaining the instantaneous voltage values stored by said first storage means.

8. The system according to claim 7 wherein said first storage means comprises a capacitor, said first amplifier means comprises at least a two stage amplifier, the first stage of which has a gain greater than unity, said AC feedback means comprises a capacitor connected from the output of said first amplifier stage to the input thereof, and said DC feedback means comprises a resistive element.

9. The system according to claim 8 including adjustable means for varying the effective capacitance of said first storage means without affecting the actual capacitance thereof.

* * * * *